United States Patent
Molnar et al.

(10) Patent No.: US 6,933,789 B2
(45) Date of Patent: Aug. 23, 2005

(54) ON-CHIP VCO CALIBRATION

(75) Inventors: Alyosha C. Molnar, Berkeley, CA (US); Rahul Magoon, Irvine, CA (US); Madhukar Reddy, Irvine, CA (US); Jackie Cheng, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 84 days.

(21) Appl. No.: 10/712,596

(22) Filed: Nov. 13, 2003

(65) Prior Publication Data

US 2005/0104665 A1 May 19, 2005

(51) Int. Cl.$^7$ .................... H03L 7/00; H03B 27/00
(52) U.S. Cl. .................. 331/2; 331/46; 331/49; 331/34; 331/177 V; 331/177 R; 331/179
(58) Field of Search .................. 331/2, 46, 49, 331/1 R, 34, 177 V, 177 R, 179

(56) References Cited

U.S. PATENT DOCUMENTS 4,510,461 A * 4/1985 Dickes et al. .............. 331/1 A
6,512,801 B1 * 1/2003 Ninomiya .................. 375/316

* cited by examiner

*Primary Examiner*—Michael B Shingleton
(74) *Attorney, Agent, or Firm*—Mintz, Levin, Cohn, Ferris, Glovsky & Pepeo, P.C.; Shane H. Hunter, Esq.

(57) ABSTRACT

Embodiments of the invention provide techniques for calibrating voltage-controlled oscillators (VCOs). Multiple VCOs may be disposed on a chip with the VCOs having different frequency ranges. The VCOs may be selected and tested to determine a desired VCO to use to tune to a selected channel frequency. Each of the VCOs has multiple possible varactor configurations. The varactor configurations of the desired VCO determined to be used to tune to the selected channel frequency can be selected and tested to determine a desired varactor configuration for the desired VCO. The desired VCO with the desired varactor configuration will preferably be able to produce a full range of desired frequencies corresponding to all channel frequencies desired.

23 Claims, 7 Drawing Sheets

ON-CHIP VCO CALIBRATION

BACKGROUND OF THE INVENTION

1. Technical Field

The invention relates to voltage-controlled oscillator calibration and more particularly to integrated, automatic, on-chip voltage-controlled oscillator calibration.

2. Background of the Invention

A voltage-controlled oscillator (VCO) is an essential circuit in a phase-locked loop (PLL) system and is used to provide an output signal whose frequency is tunable with a control voltage (tuning voltage) typically referred to as $V_{tune}$. The tuning voltage typically varies from a minimum of about a fixed voltage $V_1$ (e.g., 0.3 V) to a maximum voltage, typically referred to as $V_{CC}$, minus a fixed voltage $V_2$ (e.g. 2.7 V–0.5 V=2.2 V). Fixed voltages $V_1$ and $V_2$ are dependent on the type of charge pump that the PLL uses.

A VCO has a limited amount of tuning range. The tuning range depends, e.g., on the amount of tuning voltage $V_{tune}$ that is available, and on a varactor used by the VCO. The ratio of the frequency range and the tuning voltage is referred to as VCO sensitivity ($K_v$). Low-sensitivity VCOs are often desirable to provide good circuit characteristics to reduce or minimize noise.

SUMMARY

A number of technical advances are achieved in the art, by implementation of a VCO calibration circuit for determining which of multiple VCOs to use for normal operation of a PLL. The VCO calibration circuit may be broadly conceptualized as a system that selects which of multiple VCOs can tune to a selected frequency; thus manufacturing and temperature tolerances may be compensated for without time-consuming adjustment (e.g., trimming) of circuit components. Further, calibration may be performed automatically, and by components that are on-chip with other portions of the PLL.

For example, the VCO calibration circuit that accepts a tuning voltage may utilize a system architecture that can produce, from each VCO, a range of frequencies needed if the VCO can produce a test frequency in response to a tuning voltage within an acceptable range of tuning voltages. An implementation of the system architecture may include PLL components including a calibration circuit and a set of VCOs, each containing a fine varactor and a set of coarse varactors. The calibration circuit can select the VCOs one at a time to receive a tuning voltage. A reference frequency is set for the PLL and the PLL is allowed to settle, with a corresponding settled tuning voltage being applied to the selected VCO. Comparison circuitry compares the settled tuning voltage against high and low reference voltages. Depending on the settled tuning voltage relative to the high and low reference voltages, a different VCO is selected for testing, or the current VCO is selected (if the settled tuning voltage is between the high and low reference voltages) for use in normal operation. The VCO selected for normal use is tuned by having its coarse varactors enabled/disabled until an appropriate combination of enabled coarse varactors is determined. The combination may be stored and used for normal operation.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principals of the invention.

Reference will now be made in detail to the description of the invention as illustrated in the figures. While the invention will be described in connection with these figures, there is no intent to limit it to the embodiment or embodiments disclosed in these figures. On the contrary, the intent is to cover all alternatives, modifications, and equivalents included within the spirit and scope of the invention as defined by the appended claims.

DETAILED DESCRIPTION OF PREFERRED EMBODIMENTS

Figure 1:
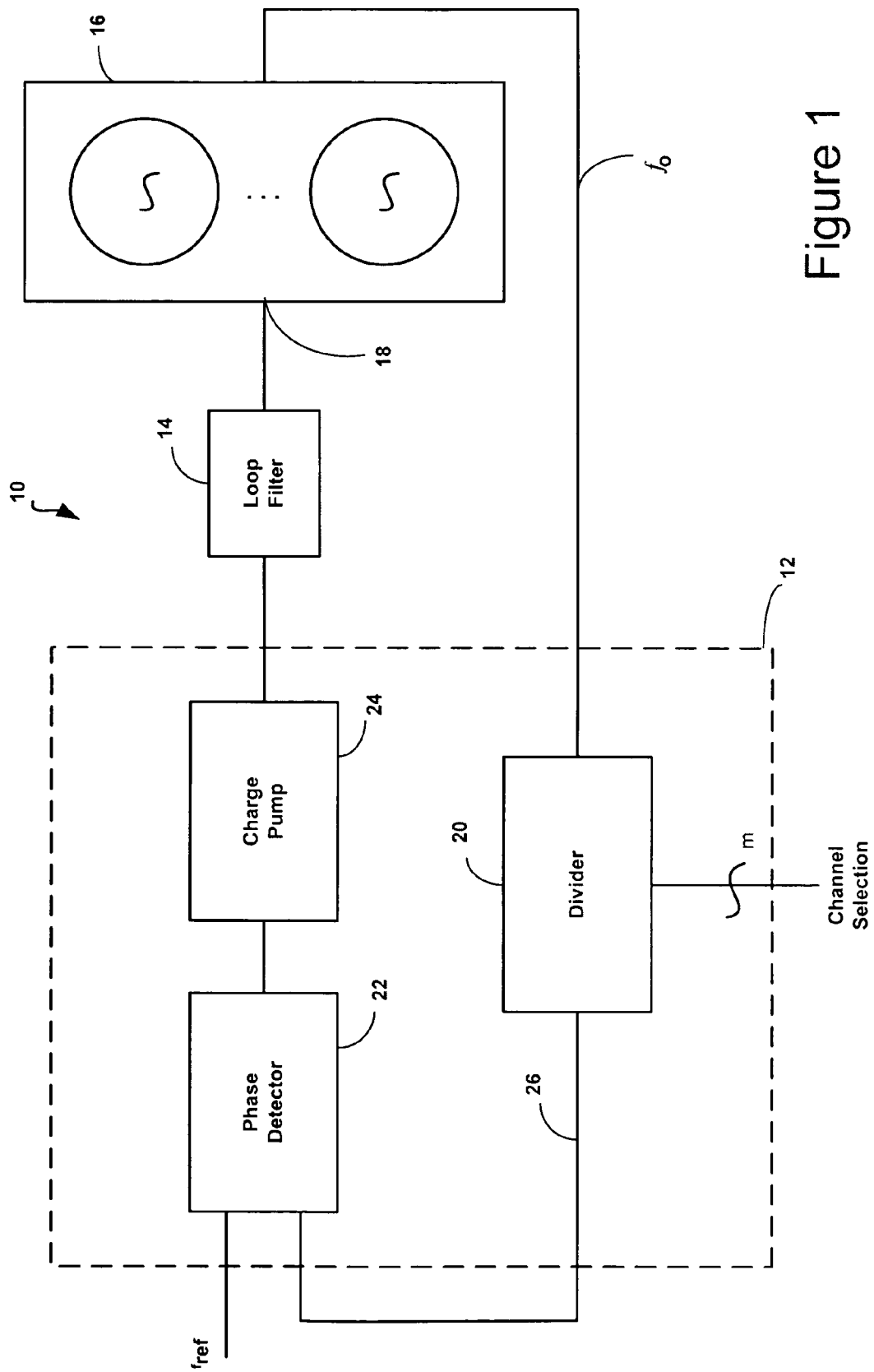
FIG. 1 is a block diagram of a phase-locked loop.

Referring to FIG. 1, a phase-locked loop (PLL) 10 includes a synthesizer 12, a loop filter 14, and a voltage-controlled oscillator (VCO) unit 16 that includes a bank of VCOs. The PLL 10 is configured to lock onto a signal having a reference frequency $f_{ref}$ provided to the synthesizer 12 and output a signal from the VCO unit 16 having a frequency $N \cdot f_{ref}$. This output signal is provided by the VCO unit 16 in response to a tuning voltage $V_{tune}$ provided at a tuning pin or tuning line 18 of the VCO 16. The voltage provided to the tuning pin 18 is provided from the loop filter 14. The loop filter 14 is a low-pass filter (LPF) that can be capacative in nature. The synthesizer 12 is configured to, during active times of the PLL 10, adjust the tuning voltage $V_{tune}$ of the VCO unit 16 depending on a phase difference between frequency $f_o$ of the VCO's output divided by N (of an N-counter described below) and the frequency $f_{ref}$ of the reference signal. The synthesizer 12 is configured to adjust the tuning voltage until the output signal from the VCO 16 has approximately the same frequency as the frequency of the reference signal. At this point, the PLL 10 is considered to be locked to the reference frequency $f_{ref}$, with the tuning voltage $V_{tune}$ at the tuning pin 18 being at a VCO-lock voltage. The PLL 10 can lock to signals spanning a channel range of frequencies, between extreme-frequency channels (i.e., a minimum-frequency channel and a maximum-frequency channel) with each of several channels in the range corresponding to a respective frequency.

To adjust the tuning voltage $V_{tune}$ during active times of the PLL 10, the synthesizer 12 includes a divider 20, a phase detector 22, and a charge pump 24. The charge pump 24 is configured to receive control signals including an error signal from the phase detector 22, and in response to these signals, to provide charge to the loop filter 14. The amount of time and polarity of the charge are determined by the control signals including the error signal. The charge from the charge pump 24, in filtered form, will be received by the VCO unit 16 and will affect the VCO tuning voltage $V_{tune}$, and therefore the output frequency $f_o$ of the output signal of the VCO unit 16. The N-counter can divide the output frequency $f_o$ by N and provide the result 26 ($f_o/N$) to the phase detector 22. The phase detector 22 is configured to compare the reference frequency $f_{ref}$ the N-divider result 26 and provide an error signal to the charge pump 24 indicative of the difference in frequencies of the reference frequency $f_{ref}$ and the N-divided result frequency $f_o/N$. The PLL 10 disposed on a single integrated circuit (IC) chip.

Figure 2:
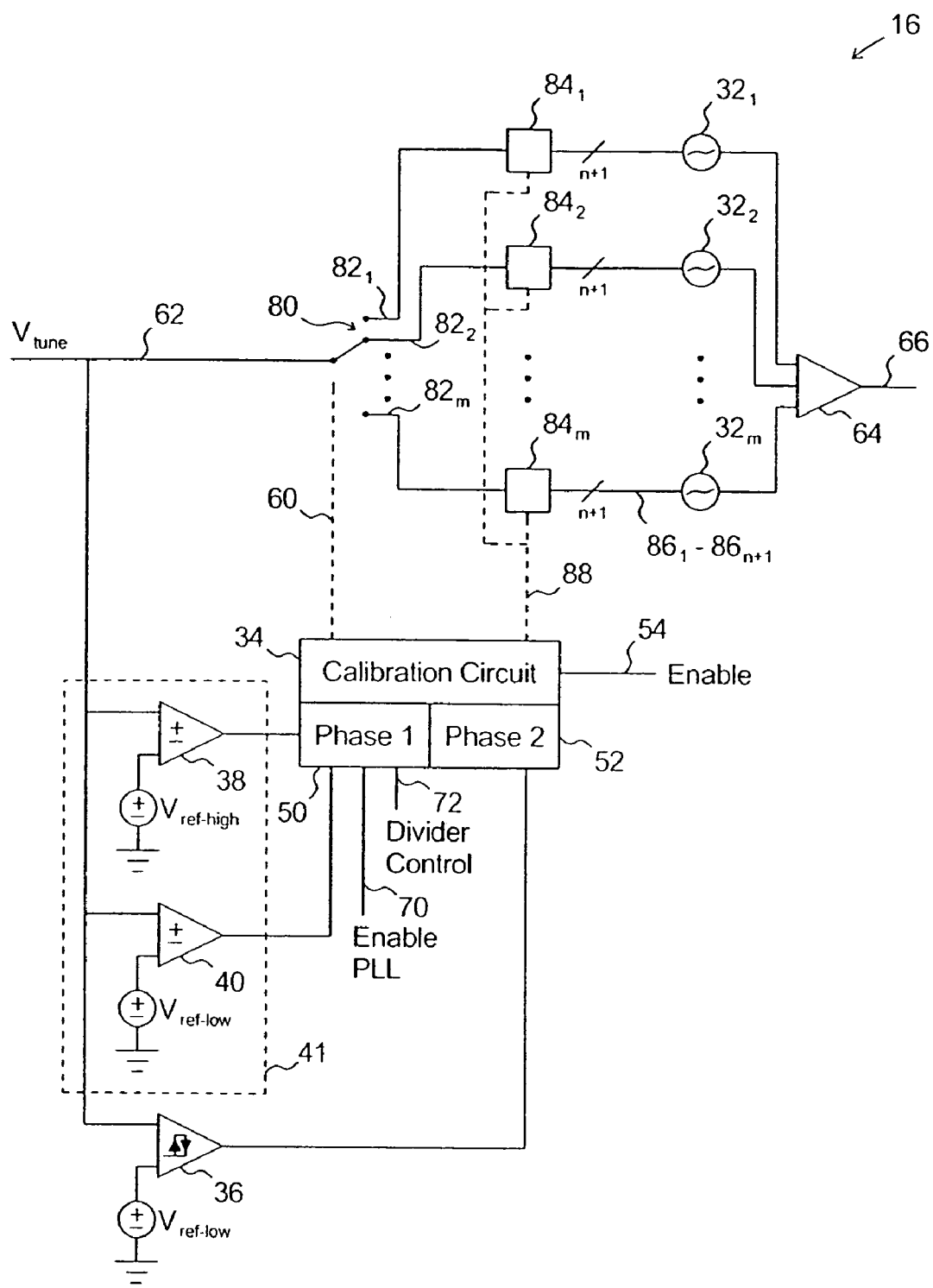
FIG. 2 is a simplified circuit diagram of a multiple-voltage-controlled-oscillator unit (multiple-VCO unit) shown in FIG. 1.

Referring to the embodiment of FIG. 2, the VCO unit 16 may include a VCO bank 30 including VCOs $32_1$–$32_m$, a calibration circuit 34, a hysteresis comparator 36, a high-voltage comparator 38, and a low-voltage comparator 40. The comparators 38 and 40 provide an envelope detector 41. The unit 16 is disposed on the same IC chip as the other components of the PLL 10 (FIG. 1). The unit 16 is configured to provide automatic calibration to determine which of the VCOs 32 to use for normal operation of the PLL 10, and to store indicia of this VCO 32 such that it is used for normal operation.

The comparators 36, 38, 40, are configured to provide outputs indicative of comparisons between the tuning voltage $V_{tune}$ and various reference voltages. The high-voltage comparator 38 outputs a logical "0" if the tuning voltage $V_{tune}$ is below a high-reference voltage $V_{ref-high}$, and outputs a logical "1" if $V_{tune}$ is above $V_{ref-high}$. The low-voltage comparator 40 outputs a logical "0" if the tuning voltage $V_{tune}$ is below a low-reference voltage $V_{ref-low}$, and outputs a logical "1" if $V_{tune}$ is above $V_{ref-low}$. The hysteresis comparator 36 is configured to compare a sum S of the tuning voltage $V_{tune}$ plus a hysteresis voltage with a hysteresis reference voltage $V_{ref-hys}$, here $V_{ref-low}$. The hysteresis voltage added to the tuning voltage $V_{tune}$ varies the voltage that is compared to the reference voltage $V_{ref-hys}$. One hysteresis voltage corresponds with a tuning voltage variation for tuning the selected VCO 32 to any given frequency channel given voltage supply and temperature variations. The hysteresis comparator 36 provides an output that is either high or low (indicating that $S \geq V_{ref-hys}$ or $S < V_{ref-hys}$, respectively).

Figure 3:
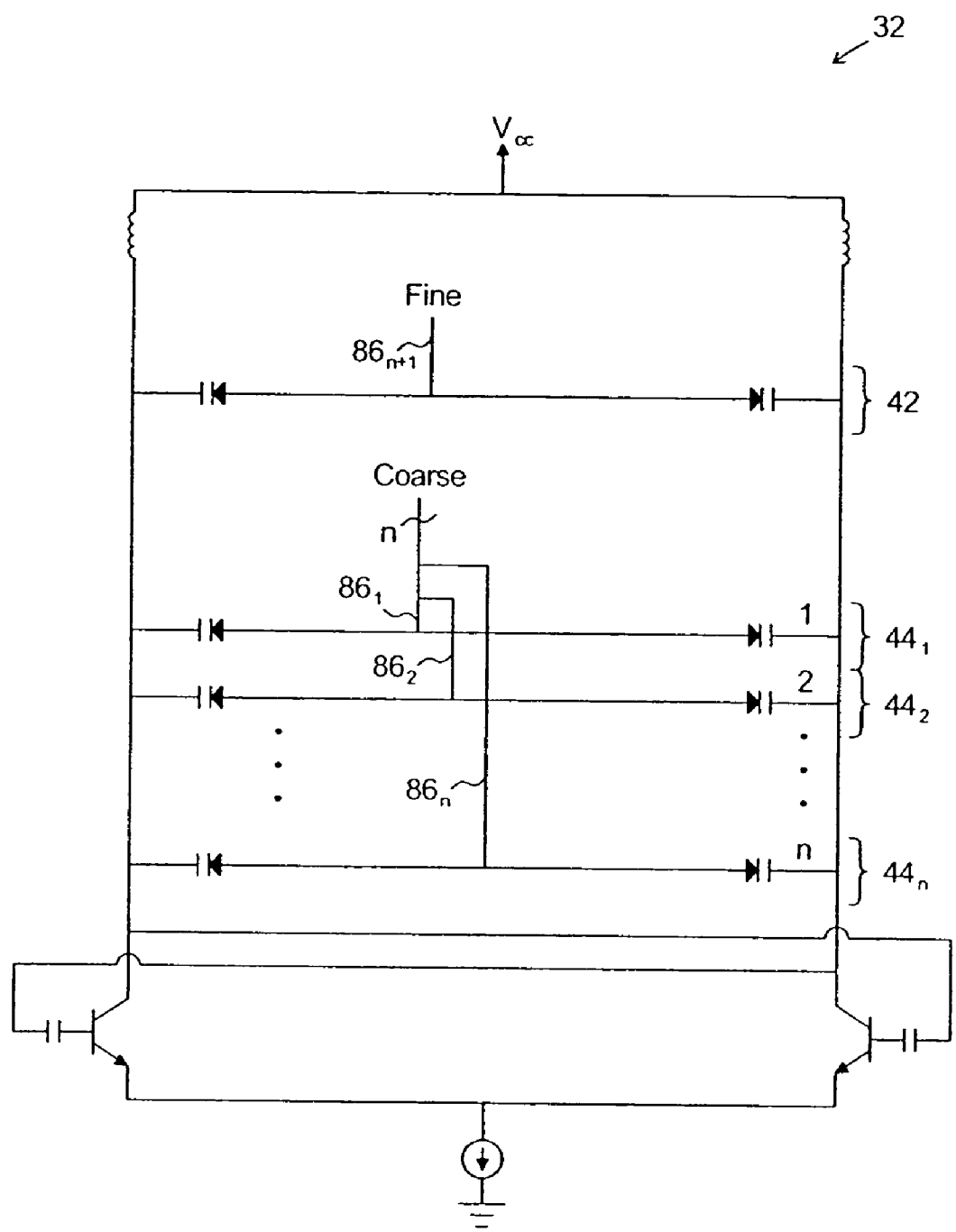
FIG. 3 is a simplified circuit diagram of a VCO from the multiple-VCO unit shown in FIG. 2.

Referring to the embodiment of FIG. 3, each VCO 32 includes a fine varactor 42 and a set of coarse varactors $44_1$–$44_n$. The varactors 42, 44 are configured to provide variable capacitance to affect the output frequency $f_o$ (FIG. 1) of the VCO unit 16 (FIG. 1). The fine varactor 42 provides slight variance in capacitance, and therefore output frequency $f_o$, while the coarse varactors 44 provide larger capacitance variation, and therefore larger output-frequency variation. In one embodiment, the coarse varactors 44 are configured with binary-weighted capacitance, such that varactor $44_2$ provides a maximum capacitance that is twice the maximum capacitance provided by varactor $44_1$, varactor $44_3$ (not shown) provides a maximum capacitance that is twice the maximum capacitance provided by varactor $44_2$, etc. up to varactor $44_n$. Each VCO 32 is configured such that if it is the selected VCO 32 (as described below with respect to FIG. 5) to provide a low-end frequency of the channel range of the PLL 10 (FIG. 1), then that VCO 32 can provide frequencies covering the entire channel range with corresponding tuning voltages $V_{tune}$ within an acceptable, effective range of tuning voltages. The VCOs 32 are designed such that the lowest-frequency producing VCO 32, with corresponding lowest-maximum-capacitance, (e.g., VCO $32_m$) will be able to produce a frequency at or below the lowest-frequency PLL channel and the highest-frequency producing VCO 32 (e.g., highest-maximum capacitance VCO $32_1$) will be able to produce a frequency at or above the highest-frequency PLL channel. The varactors 42, 44 provide a range of capacitance such that if one VCO 32 cannot tune to the lowest-frequency channel with the maximum capacitance of that VCO 32 and the tuning voltage $V_{tune}$ with the effective acceptable range, then the VCO 32 with the next-most maximum capacitance will be able to tune to the full range of channel frequencies with some varactor combination with the tuning voltage $V_{tune}$ within the effective acceptable range. Preferably, the capacitance ranges of the VCOs 32 overlap. The varactors 42, 44 are also configured such that at least one of the VCOs $32_1$–$32_m$ will be able to provide frequencies spanning the range of channel frequencies in response to the available range of tuning voltage $V_{tune}$.

Returning to FIG. 2, the calibration circuit 34 includes a first-phase portion 50 and a second-phase portion 52. The circuit 34 is configured to be activated in response to an enable signal 54 transitioning to a logical "1" such as by transitioning from a low voltage to a high voltage.

The first-phase portion 50 of the calibration circuit 34 is configured to apply a tuning voltage $V_{tune}$ to the VCOs 32 and to determine which VCO 32 can provide output signals of frequencies covering the channel range associated with the PLL 10 (FIG. 1). The first-phase portion 50 can actuate a coarse control line 60 to control a 1-to-m switch 80 to connect an input line 62 carrying the tuning voltage $V_{tune}$ to one of m lines $82_1$–$82_m$ corresponding to the m VCOs 32 (as shown, the VCO 322). Multiplexers $84_1$–$84_m$ can each connect respective lines $82_1$–$82_m$ to combinations of n+1 corresponding VCO input lines $86_1$–$86_{n+1}$ in accordance with a varactor control signal 88 from the first portion 50. The n+1 lines 86 are respectively connected to the n coarse varactors 44 and the one fine varactor 42 of each of the VCOs 32 as further illustrated in FIG. 3. The portion 50 also controls powering up of the VCOs 32. The VCOs 32 are coupled to a buffer 64 that provides the output signal 66 of the VCO unit 16 (FIG. 1) having the output frequency $f_o$. Initially, the portion 50 responds to activation by setting the synthesizer 12 (FIG. 1) to a predefined channel, here the lowest-frequency channel, and by selecting the highest-maximum-capacitance, highest-frequency producing VCO $32_m$ by actuating the switch 80 to couple the line 62 to the line $82_m$. Thereafter, the portion 50 selects which VCO 32 to use based upon signals received from the comparators 38, 40 of the envelope detector 41, and the hysteresis comparator 36. Depending upon the signals from the comparators 38, 40, the portion 50 returns to a previously-selected VCO 32, sequences to a next, lower-maximum capacitance and lower maximum-frequency-producing VCO 32, stores indicia of the currently-selected VCO, or aborts calibration. Table 1 indicates which operation the portion 50 can perform in response to each combination of signals received from the comparators 38, 40.

TABLE 1

| High-voltage Comparator 38 output | Low-voltage Comparator 40 output | Decision |
| --- | --- | --- |
| 0 | 0 | Tuning voltage is too low. Store indicia of previously-selected VCO 32, disable portion 50 and transition operation to portion 52. |
| 0 | 1 | Current VCO is good. |

TABLE 1-continued

| High-voltage Comparator 38 output | Low-voltage Comparator 40 output | Decision |
|---|---|---|
|  |  | Select current VCO 32, store indicia of current VCO, disable portion 50 and transition operation to portion 52. |
| 1 | 0 | Error. Abort operation. |
| 1 | 1 | Tuning voltage is too high. Select next VCO 32. |

The first-phase portion 50 is also configured to control other portions of the PLL 10 (FIG. 1). For example, the portion 50 can actuate other portions of the PLL 10 by activating a PLL enable line 70 (e.g., by transitioning a signal on the line 70 from a logical low to a logical high). Also, the portion 50 can send control signals on a control line 72 (that may be more than one line) to the divider 20 (FIG. 1) to set the value of N in the divider 20. The portion 50 can also monitor the tuning voltage $V_{tune}$ via lines connected to the varactors 42, 44, to see if the PLL 10 has reached a steady state.

Referring also to FIG. 3, the second-phase portion 52 is configured to adjust the combination of coarse varactors 44 such that a selected VCO 32 can tune to a programmed PLL channel using a tuning voltage $V_{tune}$ that will not cause the hysteresis comparator's output to change signs. The portion 52 may be configured not to adjust the channel selected by the first-phase portion 50, or to select the lowest-frequency channel. The portion 52 is further configured to cause the coarse and fine varactors 44, 42 to be connected for a selected VCO 32 indicated by the first-phase portion 50. The second-phase portion 52 can power up the selected VCO 32. The portion 52 is configured to respond to the output of the hysteresis comparator 36, decreasing the binary-weighted capacitance (from highest to lowest capacitance for the selected VCO) of the coarse varactor set if the hysteresis comparator output does not change signs, either in response to a single tuning voltage $V_{tune}$ or between two consecutive settled tuning voltages $V_{tune}$. In response to the hysteresis output changing signs, either in response to a single tuning voltage $V_{tune}$ or between two consecutive settled tuning voltages $V_{tune}$, the portion 52 will no longer respond to the hysteresis output and will store the configuration of coarse varactors 44 immediately previously used. For example, if the varactors 44 are sequentially removed from the combination, starting with varactor $44_n$ and working toward varactor $44_1$, then the portion 52 will respond to the hysteresis output changing polarity with varactors $44_1$–$44_x$ connected by storing the combination of varactors $44_1$–$44_{x+1}$ as the desired combination of varactors 44 to use during normal operation of the PLL (FIG. 1).

Figure 4:
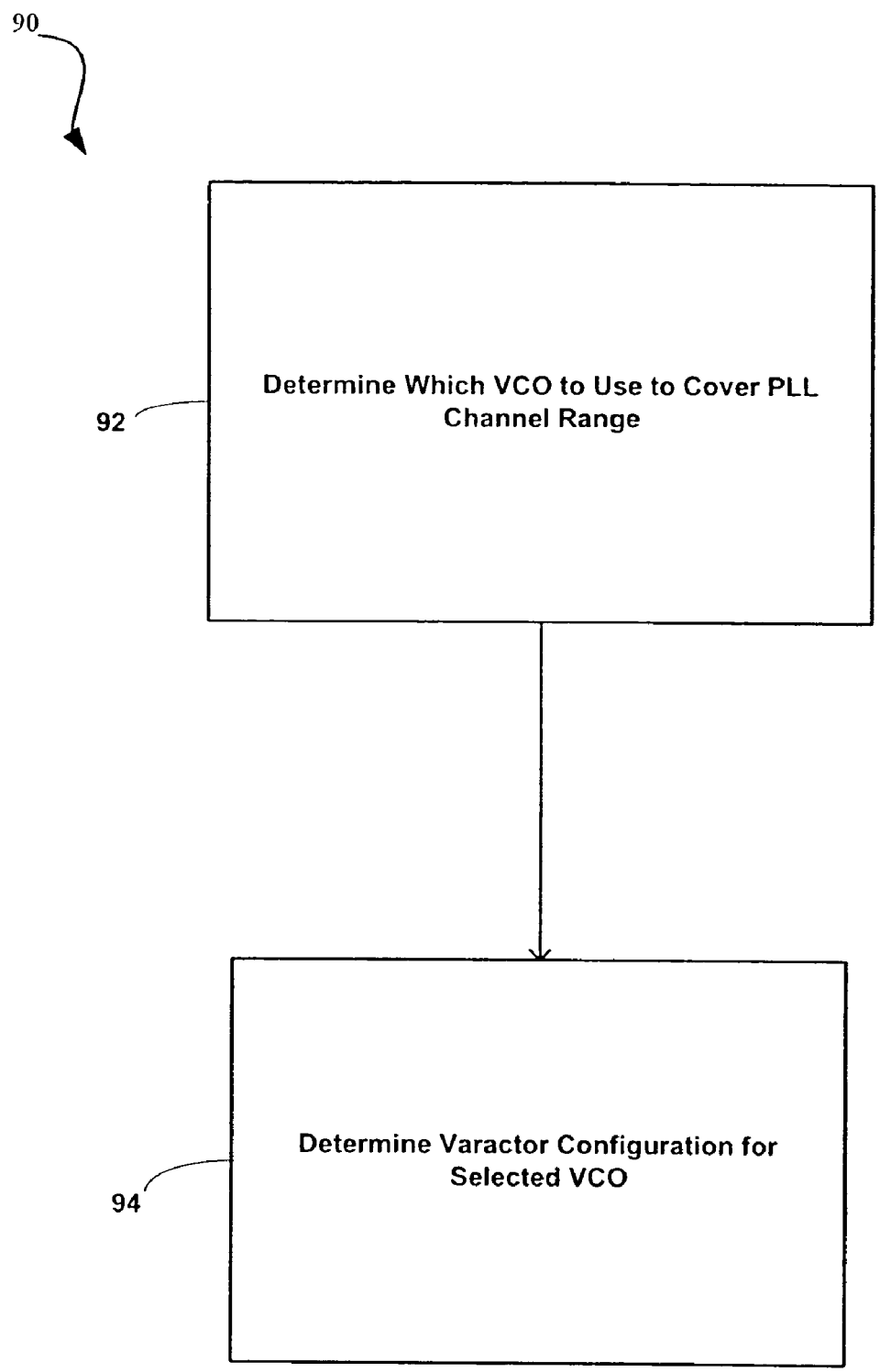
FIG. 4 is a block flow diagram of a calibration process using a calibration circuit shown in FIG. 2.

In operation, referring to the embodiment of FIG. 4, with further reference to FIGS. 1–3, a process 90 for calibrating the VCO unit 16 includes the stages shown. The process 90 includes a stage 92 where a first phase of calibration is performed, and a stage 94 where a second phase of calibration is performed. At stage 92, the first-phase portion 50 of the calibration circuit 34 determines which VCO 32 is suitable for providing frequencies covering the PLL channel range. At stage 94, the second-phase portion 52 of the calibration circuit 34 determines a configuration of the coarse varactors 44, of the VCO 3 selected by the first-phase portion 50, for use in producing the frequencies in the PLL channel range. Stages 92 and 94 are further explained with reference to FIGS. 5 and 7, respectively, below.

Figure 5:
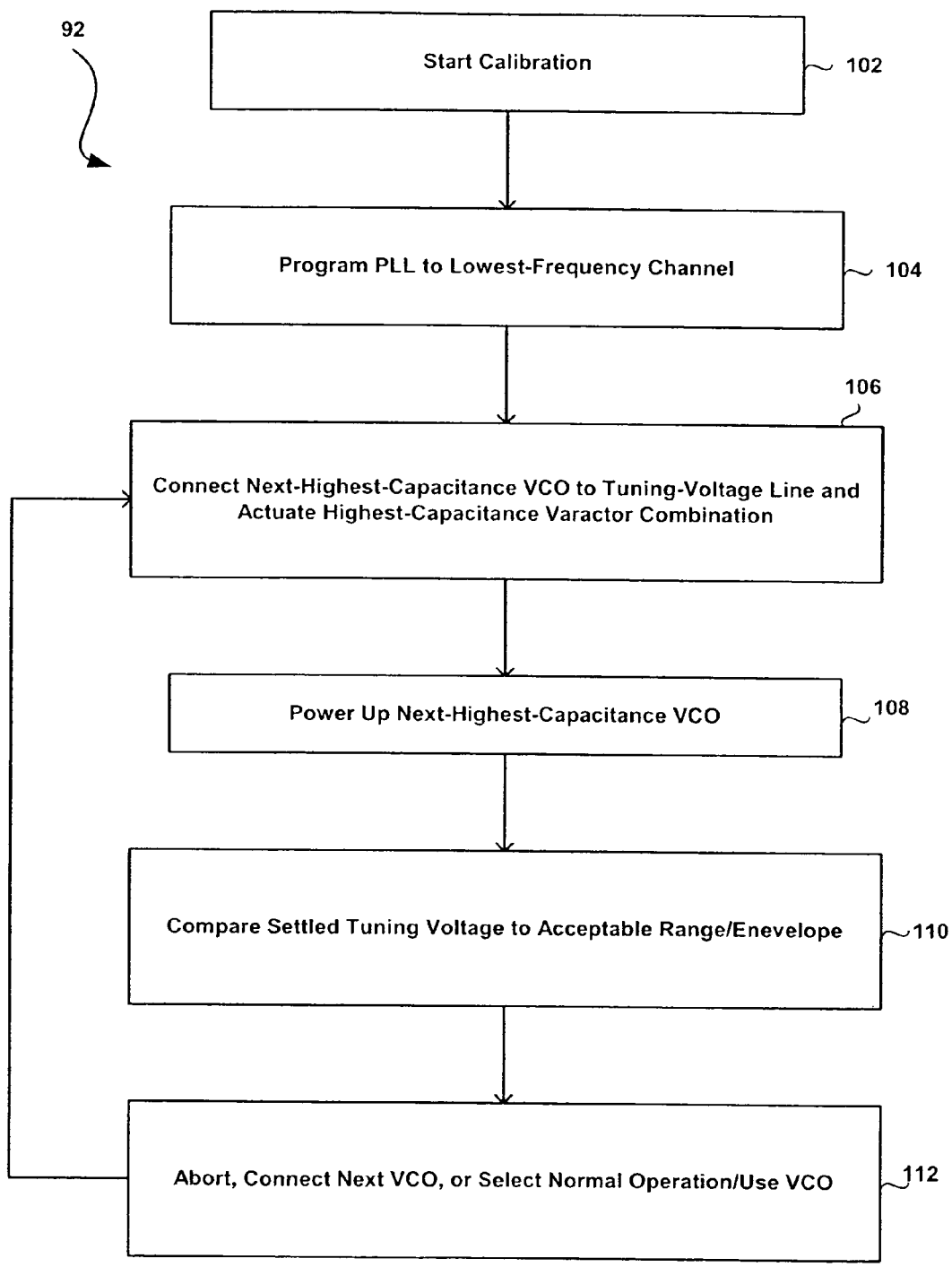
FIG. 5 is a block flow diagram of a portion of the process shown in FIG. 4.

Referring to FIG. 5, with further reference to FIGS. 1–4, the stage 92 is shown in more detail and includes the stages shown. The stages shown, however, are exemplary only and not limiting. The stages within stage 92 can be altered, e.g., by having stages added, removed, or rearranged.

At stage 102, calibration is started. Calibration start occurs in response to the PLL 10 being activated, e.g., when the chip on which the PLL 10 resides is powered up. To start calibration, the enable signal changes from a logical low to a logical high, thus enabling the calibration circuit 34. The first-phase portion 50 of the calibration circuit 34 is activated.

At stage 104, the synthesizer 12 is programmed to a predefined channel and the PLL 10 is allowed to settle. Here, the predefined channel is the one with the lowest corresponding frequency of any frequency in the PLL channel range. To set the predefined channel, the portion 50 activates the PLL enable line 70, and sends control signals on the divider control line 72 to the divider 20 to adjust the value of N in the divider to correspond to the first channel of the PLL channel range. The first-stage portion 50 waits for the PLL 10 to settle as determined by monitoring the tuning voltage $V_{tune}$.

At stage 106, the first-stage portion 50 connects the VCO 32 with the next-highest maximum capacitance varactor combination, initially VCO $32_1$, to the tuning voltage line 62 for use in providing a test frequency. The first-phase portion 50 sends a signal on the line 60 to control the switch 80 to connect the line 62, carrying the tuning voltage $V_{tune}$, to a desired line 82, e.g., initially line $82_1$, to provide the tuning voltage $V_{tune}$ to the coarse varactors 44 and the fine varactor 42 of the desired VCO 32 (VCO $32_1$ initially). The control signal 88 from the first portion 50 causes the multiplexers $84_1$–$84_m$ to couple the corresponding lines 82 (and thus the tuning voltage for the selected initial line $82_1$) to all of the lines $86_1$–$86_{n+1}$ for each VCO 32.

At stage 108, the first-stage portion 50 powers up the connected VCO 32 (again, initially the VCO $32_1$). The portion 50 powers up the VCO $32_1$ by controlling each VCO's bias circuit.

At stage 110, the tuning voltage $V_{tune}$ is compared to the acceptable tuning voltage range by the envelope detector 41. The high-voltage comparator 38 compares the tuning voltage $V_{tune}$ against the high-voltage reference $V_{ref-high}$ and outputs a logical 0 if the tuning voltage $V_{tune}$ does not exceed the high reference $V_{ref-high}$, and outputs a logical 1 otherwise. The low-voltage comparator 40 compares the tuning voltage $V_{tune}$ against the low-voltage reference $V_{ref-low}$ and outputs a logical 0 if the tuning voltage $V_{tune}$ does not exceed the low reference $V_{ref-low}$, and outputs a logical 1 otherwise.

Figure 6:
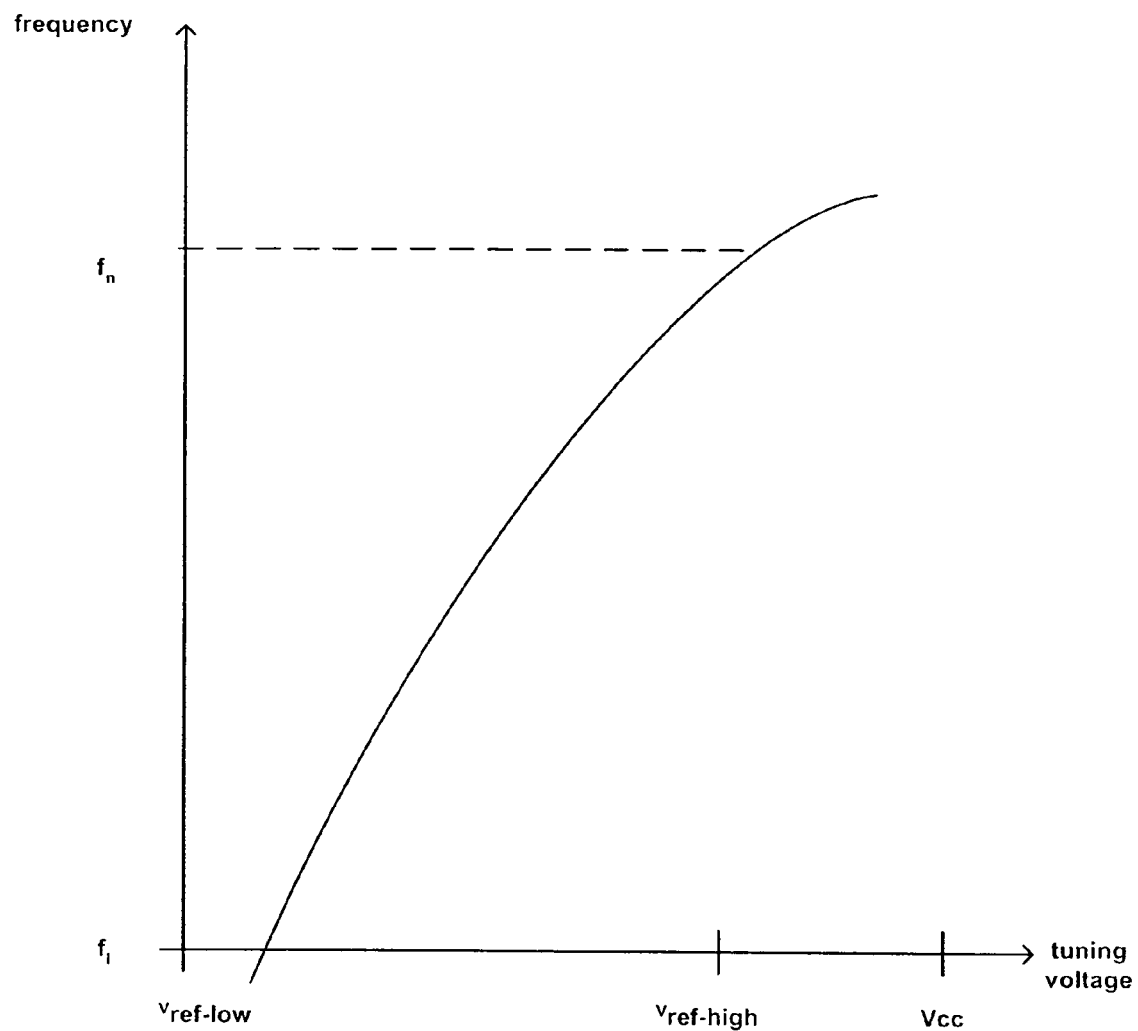
FIG. 6 is a plot of PLL channel frequency vs. VCO tuning voltage.

At stage 112, the first-phase portion 50 analyzes the outputs of the comparators 38, 40, and either selects a VCO 32 for further calibration at stage 94 (FIG. 4), aborts the calibration, or changes VCOs 32 for further calibration using the portion 50. Applying Table 1, if the high-voltage comparator 38 outputs a logical 1 and the low-voltage comparator 40 outputs a logical 0, then the portion 50 aborts the calibration and indicates an error. The same would be true if the high-voltage comparator 38 and low-voltage comparator each output a logical 0 with the highest-frequency-producing VCO $32_1$ selected, but by design this should never occur. If the high-voltage comparator 38 outputs a logical 1 and the low-voltage comparator 40 outputs a logical 1, then the portion 50 returns to stage 106 and selects the next VCO 32, e.g., VCO $32_2$, using the control signal 60, turns the current VCO $32_1$ off, and waits for the PLL 10 to settle using the next VCO $32_2$. If the high-voltage comparator 38 outputs a logical 0 and the low-voltage comparator 40 outputs a logical 0, then the portion 50 stores one or more indications to use the previously-selected VCO 32 (if any) as a normal-use VCO $32_{nu}$, and the circuit 34 disables the first-phase portion 50 and enables the second-phase portion 52. If the high-voltage comparator 38 outputs a logical 0 and the low-voltage comparator 40 outputs a logical 1, then the portion 50 analyzes the hysteresis comparator's output. If this output is stable, the portion 50 stores one or more indications to use the currently-selected VCO 32 as a normal-use VCO $32_{nu}$, and the circuit 4 disables the first-phase portion 50 and enables the second-phase portion 52. If the hysteresis comparator's output changes sign, the portion 50 acts as though both comparators 38, 40 provided logical 0's. The comparisons by the comparators 36, 38, 40, and the corresponding analysis by the first-phase portion 50, helps ensure that the selected VCO $32_{nu}$ can provide a frequency of the first PLL channel. In a preferred embodiment, the design of the VCOs 32 provides a frequency-to-voltage dependency as shown in FIG. 6 that helps ensure that the selected VCO $32_{nu}$ will also be able to produce frequencies for the remaining PLL channels using at least one combination of the coarse varactors 44.

Figure 7:
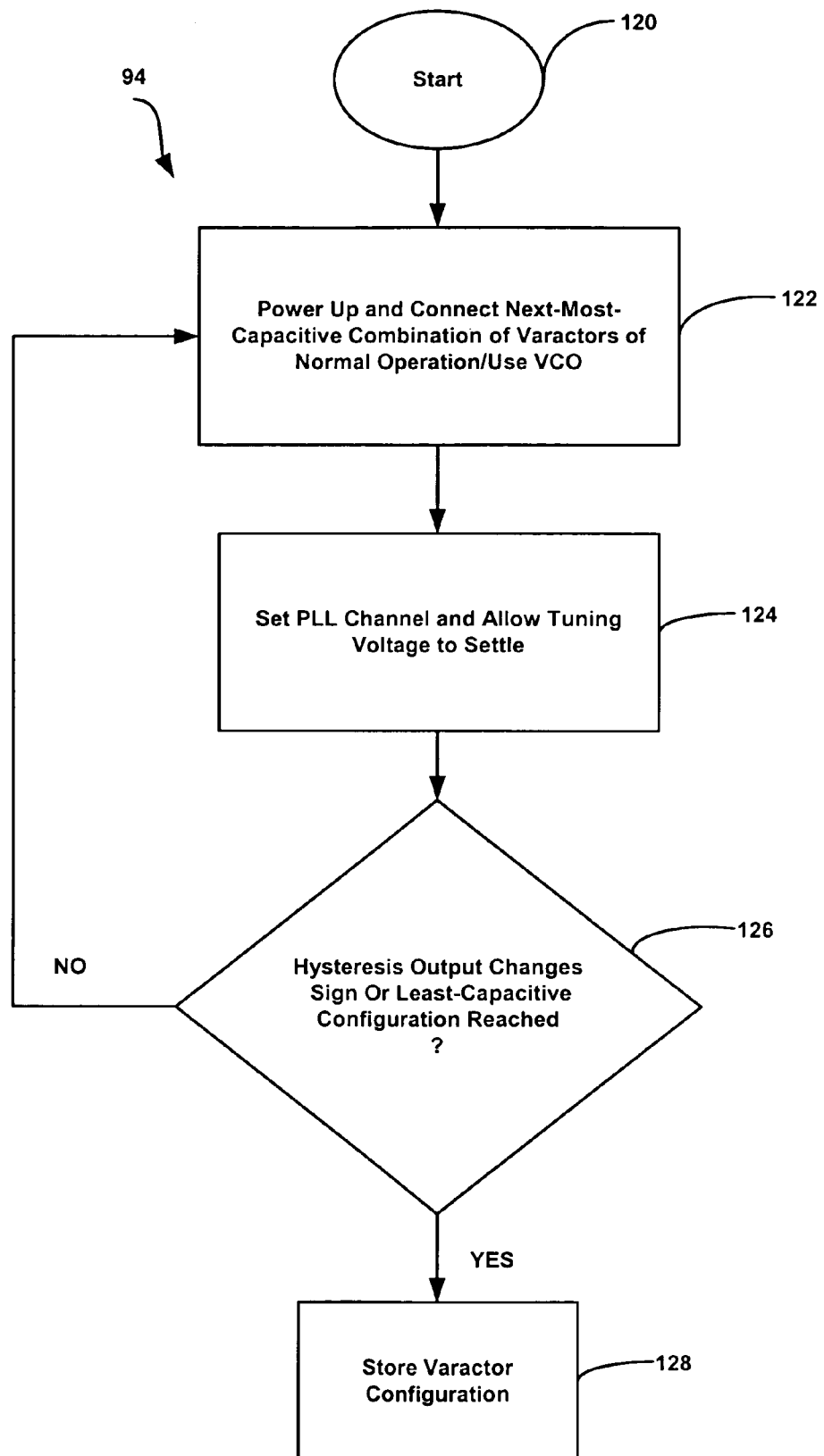
FIG. 7 is a block flow diagram of another portion of the process shown in FIG. 4.

Referring to FIG. 7, with further reference to FIGS. 1–4, the stage 94 is shown in more detail and may include the stages shown. The stages shown, however, are exemplary only and not limiting. The stages within stage 94 can be altered, e.g., by having stages added, removed, or rearranged.

At stage 120, the second-phase portion 52 starts operation. The portion 52 begins in response to actuation by the first-phase portion 50, and operates on the $VCO_{nu}$ selected by the first-phase portion 50.

At stage 122, the second-phase portion 52 powers up, and connects all of the varactors 42, 44 of, the selected VCO $32_{nu}$ using the control signals 60, 88. The portion 52 activates the appropriate line 60 to connect the input line 62, carrying the tuning voltage $V_{tune}$, to the line 82 corresponding to the selected VCO $32_{nu}$. The portion 52 powers up the selected VCO $32_{nu}$ by controlling its bias line.

At stage 124, the PLL 10 is set to a predetermined channel and allowed to settle. Again, the lowest-frequency channel is used, either by not changing the channel selected at stage 92, or by selecting this channel in stage 124 using the second-phase portion 52. Preferably, to set the predetermined channel, the second-phase portion 52 does not change the channel selection performed by the first-phase portion 50. The second-stage portion 50 waits for the PLL 10 to settle as determined by monitoring the tuning voltage $V_{tune}$.

At stage 126, the tuning voltage $V_{tune}$ is compared with an on-chip reference voltage, $V_{ref-low}$, by the hysteresis comparator 36 and the output of the comparator 36 is monitored by the second-phase portion 52. If the portion 52 does not detect that the polarity of the hysteresis-comparator output changes, either in response to a single tuning voltage $V_{tune}$ or between two consecutive settled tuning voltages $V_{tune}$, then the process 94 returns to stage 122 where the portion 52 decrements the binary weighting of the capacitance of the coarse varactor set. To do this, the second portion 52 sends the control signal 88 to couple the line 82 initially to all the coarse varactors 44. The control signal 88 is used to decrement the connections to the coarse varactors in a binary sequence (from most-capacitive combination to least-capacitive combination). For example, assume four coarse varactors 44 represented by a four-digit binary-connection number with a 1 indicating connection to the corresponding varactor 44 and a 0 indicating disconnection from the corresponding varactor 44. Also assume that the most-significant bit corresponds to the highest-capacitance varactor, here $44_4$, and the least-significant bit corresponds to the least-capacitive varactor 44, here $44_1$. In this case, initially the binary connection number is 1111. The binary-connection number, and thus the corresponding connections of the varactors 44, may proceed in binary descending order, to 1110, then 1101, then 1100, . . . 0011, 0010, 0001, 0000 (with 0000, only the fine varactor 42 is connected).

At stage 128, if the portion 52 detects that the polarity of the hysteresis-comparator output changes, either in response to a single tuning voltage $V_{tune}$ or between two consecutive settled tuning voltages $V_{tune}$, then the portion 52 terminates the analysis, and stores the configuration of the varactors 44 in the immediately prior analysis. The portion 52 adds a binary 1 to the current binary combination of varactors 44 (e.g., if current combination is 0010, then the new combination from the prior analysis is 0011). Also, if the least-capacitance varactor combination is used without a change in sign of the hysteresis output, then the least-capacitance varactor configuration is stored. The portion 52 stores the varactor configuration on chip for future reference during normal operation/use. The stored indicia for the VCO $32_{nu}$ and the configuration of the coarse varactors 44 defines the VCO 32 and its setting for providing signals of frequencies spanning the PLL channel range. In one embodiment, the circuit 34 disables the second-phase portion 52 in response to storing the varactor configuration.

The stored varactor configuration corresponds to the lowest-capacitance combination of coarse varactors 44 that allow the VCO 32 to tune to the lowest-frequency channel with a corresponding tuning voltage $V_{tune}$ within an effective acceptable range of tuning voltages $V_{tune}$. The corresponding tuning voltage $V_{tune}$ is within the acceptable range of tuning voltages, and higher than the minimum tuning voltage by at least enough to compensate for supply and temperature variations. The range within the range from $V_{ref-low}$ to $V_{ref-high}$ accounting for supply and temperature variations (i.e., ($V_{ref-low}+V_{tol-low}$) to ($V_{ref-high}-V_{tol-high}$)) is the effective acceptable tuning voltage range. The low-end and high-end voltage tolerances $V_{tol-low}$ and $V_{tol-high}$, may be the same.

The process 90 shown in general in FIG. 4, and in more detail in FIGS. 5 and 7, is generally performed upon powering up of the system 10 shown in FIG. 1. The process 90 stores the indicia of the $VCO_{nu}$ selected for normal use/operation, and the configuration of the coarse varactors 44 (the n-weighted number). During normal operation, the calibration is preferably not repeated, with the selected $VCO_{nu}$ tuning to whatever PLL channel is programmed into, or otherwise selected using, the divider 20 (FIG. 1).

While various embodiments of the application have been described, it will be apparent to those of ordinary skill in the art that many more embodiments and implementations are possible that are within the scope of this invention. For example, the unit 16 may be configured such that the combination of coarse varactors is varied from least-capacitive to most-capacitive, or some other sequence, in stage 94. Also, the multiplexers 84 could be 1-to-n multiplexers, with a line connecting the respective lines 82 to the line 86 coupled to the fine varactor 42 of each corresponding VCO 32, such that the line 86 connected to the fine varactor 42 is not connected through the multiplexer 84 to the line 82. Further, the varactor combination could be determined by setting the PLL channel to one extreme (e.g., lowest frequency), allowing the tuning voltage to settle, comparing the settled tuning voltage to the corresponding extreme (lowest in this example) voltage with the hysteresis comparator 36, setting the PLL channel to other extreme (highest frequency), allowing the tuning voltage to settle, and comparing the settled tuning voltage to the corresponding other extreme (highest) voltage with another hysteresis comparator. Also, the varactor combination could be verified by checking the other-extreme channel (i.e., opposite that used to determine the varactor combination) and measuring whether the settled tuning voltage is within the effective acceptable range using another hysteresis comparator. Further, the stage 94 could be changed such that the portion 52 sets the channel to the highest-frequency channel and sets the varactor combination to the lowest-capacitance combination, changes the varactor combination to increase the capacitance, and stores the varactor combination that first causes the hysteresis comparator to indicate that the settled tuning voltage $V_{tune}$ is above the low-voltage reference $V_{ref-low}$, without the hysteresis comparator output changing signs while applying the hysteresis voltage to the tuning voltage $V_{tune}$. Still further, the portion 52 could apply this same technique but store any varactor combination that satisfies the stated criteria and that can tune to the highest-frequency channel with a settled tuning voltage $V_{tune}$ being less than the high-voltage reference $V_{ref-high}$, including the appropriate hysteresis voltage.

What is claimed is:

1. In a phase-locked loop (PLL) disposed on a circuit chip and including a synthesizer, a voltage-controlled oscillator (VCO) calibration system disposed on the circuit chip comprising:
   an input configured to receive a tuning voltage;
   a plurality of VCOs in a set of VCOs, each VCO including a plurality of selectively coupled varactors;
   a tuning-voltage-distribution circuit configured to couple the input to the VCOs; and
   a calibration circuit coupled to at least one of the power distribution circuit and the set of VCOs and configured to control tuning voltage distribution from the input to selective varactors of each VCO, to determine a selected VCO of the set of VCOs that is capable of producing a desired range of frequencies in response to tuning voltages within a desired range of tuning voltages, and to determine a desired combination of the varactors to use in the selected VCO to produce the desired range of frequencies in response the tuning voltages within the desired range of tuning voltages.

2. The system of claim 1 wherein the calibration circuit is further configured to set the synthesizer to an extreme-frequency channel, and to control the distribution circuit to provide the tuning voltage to a combination of varactors providing an extreme capacitance for each VCO.

3. The system of claim 2 wherein the calibration circuit is further configured to control a portion of the set of VCOs to produce an output frequency corresponding to the extreme-frequency channel, and to determine the selected VCO based on a level of the tuning voltage used by each VCO, in the portion of VCOs, to produce the output frequency.

4. The system of claim 3 wherein the calibration circuit is further configured to determine the selected VCO in response to whether the level of the tuning voltage used by each VCO, in the portion of VCOs, to produce the output frequency is in a range from a minimum tuning voltage to a maximum tuning voltage.

5. The system of claim 4 wherein the calibration circuit is further configured to determine the selected VCO in response to whether the level of the tuning voltage used by each VCO, in the portion of VCOs, to produce the output frequency is in an effective range of acceptable tuning voltages.

6. The system of claim 2 wherein the extreme-frequency channel is the lowest-frequency channel, and the extreme capacitance is the lowest capacitance amount available for each VCO.

7. The system of claim 1 wherein the calibration circuit is configured to set the synthesizer to an extreme-frequency channel, and to determine the desired combination of the varactors by adjusting which varactors of the selected VCO receive the tuning voltage and determining whether a level of the tuning voltage used by the selected VCO to produce an output frequency corresponding to the extreme-frequency channel is within the desired range of tuning voltages.

8. The system of claim 7 wherein the desired range of tuning voltages is an effective range of acceptable tuning voltages.

9. A circuit chip comprising:
   a first portion of a phase-locked loop circuit; and
   a second portion of a phase-locked loop circuit coupled to the first portion of the phase-locked loop circuit and comprising a voltage-controlled oscillator (VCO) calibration system comprising:
      an input configured to receive a tuning voltage;
      a plurality of VCOs each including a plurality of selectively coupled varactors;
      a tuning voltage distribution circuit configured to couple the input to a selected VCO and a selected combination of varactors of the selected VCO;
      a voltage range indicator circuit coupled to the input and configured to provide indicia of whether the tuning voltage is within a desired range; and
      a calibration circuit coupled to the input, the tuning voltage distribution circuit, and the voltage range indicator circuit, and configured to control the tuning voltage distribution circuit to control distribution of the tuning voltage to selective varactors of each VCO, to determine a selected VCO that is capable of producing a desired range of frequencies in response to tuning voltages within the desired range of tuning voltages, and to determine a desired combination of the varactors to use in the selected VCO to produce the desired range of frequencies in response the tuning voltages within the desired range of tuning voltages.

10. The circuit chip of claim 9 wherein the first portion of the phase-locked loop circuit includes a synthesizer and the calibration circuit is configured to set the synthesizer to an extreme-frequency channel, to control the tuning voltage distribution circuit to provide the tuning voltage to a combination of varactors providing an extreme capacitance for the selected VCO, and to determine the desired combination of the varactors by adjusting which varactors of the selected VCO receive the tuning voltage and determining whether a level of the tuning voltage used by the selected VCO to produce an output frequency corresponding to the extreme-frequency channel is within the desired range of tuning voltages.

11. The circuit chip of claim 10 wherein the voltage range indicator circuit comprises a low-voltage determining circuit, a high-voltage determining circuit, and a voltage-tolerance circuit, and wherein outputs from the low-voltage determining circuit, high-voltage determining circuit, and voltage-tolerance circuit indicate whether a given tuning voltage is within the desired range of tuning voltages.

12. The circuit chip of claim 11 wherein the desired range of tuning voltage is an effective range of acceptable tuning voltages.

13. In a phase-locked loop (PLL) disposed on a circuit chip and including a synthesizer, an on-chip voltage-controlled oscillator (VCO) calibration system comprising:
   an input configured to receive a tuning voltage;
   a switch configured to selectively couple the input to respective ones of a plurality of first lines in response to a switch control signal;
   a plurality of multiplexers coupled to respective first lines and each configured to connect its respective first line to a plurality of second lines in response to a multiplexer control signal;
   a plurality of VCOs corresponding to the plurality of first lines, each VCO including a fine varactor coupled to the respective first line, each VCO further including a plurality of coarse varactors coupled to a respective plurality of second lines;
   a hysteresis comparator coupled to the input and configured to compare the tuning voltage with a hysteresis reference voltage and to provide a hysteresis output indicative of the comparison of the tuning voltage and the hysteresis reference voltage;
   a high-voltage comparator coupled to the input and configured to compare the tuning voltage with a high reference voltage and to provide a first output indicative of the comparison of the input voltage and the high reference voltage;
   a low-voltage comparator coupled to the input and configured to compare the tuning voltage with a low reference voltage and to provide a second output indicative of the comparison of the input voltage and the low reference voltage; and
   a calibration circuit, coupled to the switch, the multiplexers, the hysteresis comparator, the high-voltage comparator, the low-voltage comparator, and at least one of the power distribution circuit and the set of VCOs, for providing the switch control signal and the multiplexer control signals, for controlling tuning voltage distribution from the input to selective ones of the varactors of each VCO, determining a selected VCO from the plurality of VCOs that is capable of producing a desired range of frequencies in response to tuning voltages within a desired range of tuning voltages, and determining a desired combination of the varactors to use in the selected VCO to produce the desired range of frequencies in response the tuning voltages within the desired range of tuning voltages.

14. The system of claim 13 wherein the calibration circuit is configured to determine the selected VCO in response to the first and second outputs, and the tuning voltage.

15. The system of claim 14 wherein the calibration circuit is configured to determine the desired combination of varactors in response to the hysteresis output and at least one of the first and second outputs.

16. A calibration method for selecting a voltage-controlled oscillator (VCO), from a plurality of VCOs, and a varactor configuration for the selected VCO, to provide frequencies for a phase-locked loop (PLL) to use to lock to a plurality of channels having a corresponding plurality of frequencies, the method comprising:
   setting a channel of the PLL to an extreme-frequency channel of the plurality of channels, the extreme-frequency channel being a channel having one of a highest-corresponding frequency and a lowest-corresponding frequency of the corresponding plurality of frequencies;
   providing, one VCO at a time, power and a tuning voltage to an extreme-capacitance combination of varactors of at least one of the VCOs, the extreme varactor combination providing one of a highest-capacitance amount available and a lowest-capacitance amount available;
   allowing the tuning voltage provided to a VCO of the at least one of the VCOs, that is currently receiving power and the tuning voltage, to settle to a first settled tuning voltage;
   determining whether the first settled tuning voltage is within an acceptable range of tuning voltages;
   selecting a VCO whose corresponding first settled tuning voltage is within the acceptable range of voltages;
   determining a desired combination of varactors for the selected VCO such that the selected VCO can provide frequencies associated with the plurality of frequencies corresponding to the plurality of channels with a second settled tuning voltage being within the acceptable range of voltages.

17. The method of claim 16 wherein determining the desired combination of varactors includes changing combinations of varactors of the selected VCO that receive the tuning voltage.

18. The method of claim 17 wherein changing combinations of varactors that receive the tuning voltage causes capacitance of the varactor combinations to change in a consecutively decreasing manner of available capacitances.

19. The method of claim 18 wherein the desired combination is the combination that provides the lowest available capacitance with the second settled tuning voltage being within the acceptable range.

20. The method of claim 17 wherein changing combinations of varactors that receive the tuning voltage causes capacitance of the varactor combinations to change in a consecutively increasing manner of available capacitances.

21. The method of claim 20 wherein the desired combination is the combination that provides the highest available capacitance with the second settled tuning voltage being within the acceptable range.

22. The method of claim 16 wherein the acceptable range is an effective acceptable range.

23. The method of claim 16 wherein the extreme-frequency channel has the lowest-corresponding frequency, and the extreme-capacitance combination of varactors provides the highest-capacitance amount available.

* * * * *